(12) United States Patent  
Wicks et al.

(10) Patent No.: US 9,659,113 B2
(45) Date of Patent: May 23, 2017

(54) TECHNIQUE FOR ESTABLISHING PREDICTIVE REACH THROUGH A DEVIATED WELL

(71) Applicant: Schlumberger Technology Corporation, Sugar Land, TX (US)

(72) Inventors: Nathaniel Wicks, Somerville, MA (US); Jahir Pabon, Newton, MA (US); Yong Chang, Missouri City, TX (US); Shunfeng Zheng, Katy, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 685 days.

(21) Appl. No.: 13/834,034

(22) Filed: Mar. 15, 2013

(65) Prior Publication Data

US 2013/0246029 A1    Sep. 19, 2013

Related U.S. Application Data

(60) Provisional application No. 61/611,491, filed on Mar. 15, 2013.

(51) Int. Cl.
  G06G 7/48    (2006.01)
  G06F 7/60    (2006.01)
  G06F 17/50   (2006.01)
  E21B 23/00   (2006.01)

(52) U.S. Cl.
  CPC .......... *G06F 17/5009* (2013.01); *E21B 23/00* (2013.01)

(58) Field of Classification Search
  CPC .................... E21B 23/00; E21B 43/00
  USPC ........................................ 703/2, 10
  See application file for complete search history.

(56) References Cited

U.S. PATENT DOCUMENTS

| 6,439,318 | B1 | 8/2002 | Eddison et al. |
| 6,502,638 | B1 * | 1/2003 | Stoesz ............ E21B 31/113 166/177.6 |
| 6,679,341 | B2 | 1/2004 | Bloom et al. |
| 6,907,927 | B2 | 6/2005 | Zheng et al. |
| 7,139,219 | B2 | 11/2006 | Kollé et al. |
| 7,219,726 | B2 | 5/2007 | Zheng et al. |

(Continued)

OTHER PUBLICATIONS

Menand et al., "Advancements in 3D Drillstring mechanics: From the Bit to the Topdrive", 2006 IADC/SPE drilling conference, Society of Petroleum Engineers, pp. 1-12.*

(Continued)

*Primary Examiner* — Dwin M Craig
*Assistant Examiner* — Juan Ochoa
(74) *Attorney, Agent, or Firm* — Michael L. Flynn; Jody Lynn DeStefanis; Robin Nava (57) ABSTRACT

A method of estimating extended reach for a downhole line traversing a deviated section of a well. The method may include storing line and well architectural and physical data and then performing a static analysis of substantially axial-exclusive estimated friction between the line and well wall during conveyance (which may be thought of as the contact force due to interference therebetween). A one dimensional dynamic analysis may then be performed. Thus, based on these factors, speed of the conveyance, vibration parameters of an incorporated vibration tool, etc., an efficient simulation of the conveyance may be run.

18 Claims, 5 Drawing Sheets

(56) References Cited

U.S. PATENT DOCUMENTS

| | | | |
|---|---|---|---|
| 7,513,305 B2* | 4/2009 | Wilson | E21B 23/14 |
| | | | 166/242.2 |
| 7,757,793 B2 | 7/2010 | Voronin et al. | |
| 9,091,139 B2* | 7/2015 | Weng | E21B 44/00 |
| 2010/0276204 A1 | 11/2010 | Connell et al. | |
| 2011/0203395 A1 | 8/2011 | Pfahlert | |
| 2015/0090452 A1* | 4/2015 | Sangare | E21B 43/1195 |
| | | | 166/297 |

OTHER PUBLICATIONS

Menand et al., Axial Force Transfer of Buckled Drill Pipe in Deviated Wells, Jan. 1, 2009, Society of Petroleum Engineers, SPE-119861-MS, doi:10.2118/119861-MS, pp. 1-12.*

Sikal et al., "Drillpipe stress distribution and cumulative fatigue analysis in complex well drilling: New approach in fatigue optimization", 2008, SPE Annual Technical Conference and Exhibition, Society of Petroleum Engineers, pp. 1-17.*

Bhalla, Coiled tubing extended reach technology, 1995, Offshore Europe conference, pp. 392-405.*

Zheng and Sarmad, "The Penetration of Coiled Tubing With Residual Bend in Extended-Reach Wells", Oct. 9-12, 2005, SPE Annual Technical Conference and Exhibition, Dallas TX, pp. 220-225.*

Mohd Nur Fitri Ismail, Reduction of downhole friction by electro-chemical methods, 2010, Dissertation University of Southampton, pp. 1-253.*

Stephane Menand et al., "How drillstring rotation affects critical buckling load?", 2008, IADC/SPE Drilling Conference, Society of Petroleum Engineers, pp. 1-13.*

Jahir Alfonso Pabon, et al. "Modeling transient vibrations while drilling using a finite rigid body approach", 2010, Society of Petroleum Engineers Deepwater Drilling and Completions Conference, pp. 1-15.*

Al-Dhufairi et al., "Expanding the Envelope of Coiled-Tubing (CT) Reach for Stimulation of Ultradeep Openhole Horizontal Wells", 2010, Society of Petroleum Engineers/ICoTA Coiled Tubing and Well Intervention Conference and Exhibition, pp. 1-11.*

Adewuya, et al., "A Robust Torque and Drag Analysis Approach for Well Planning and Drillstring Design", SPE 39321—IADC/SPE Drilling Conference, Dallas, Texas, Mar. 3-6, 1998, pp. 1-16.

Long, et al., "A New Approach to Directional Survey Interpretation and Course Correction by the Sectional Method", Journal of Energy Resources Technology, vol. 114 (2), Jun. 1, 1992, pp. 163-174.

Newman, Kenneth R., "Vibration and Rotation Considerations in Extending Coiled-Tubing Reach", SPE 106979—SPE/lCoTA Coiled Tubing and Well Intervention Conference and Exhibition, The Woodlands, Texas, U.S.A., Mar. 20-21, 2007, pp. 1-9.

Radzimovsky, Eugene I., "Stress Distribution and Strength Condition of Two Rolling Cylinders Pressed Together", University of Illinois Engineering Experiment Station, Bulletin Series, No. 408, 1953, 46 pages.

Rezmer-Cooper, et al., "Field Data Supports the Use of Stiffness and Tortuosity in Solving Complex Well Design Problems", SPE 52819—SPE/IADC Drilling Conference, Amsterdam, Netherlands, Mar. 9-11, 1999, pp. 1-14.

Sawaryn, et al., "A Compendium of Directional Calculations Based on the Minimum Curvature Method", SPE 84246—SPE Drilling & Completion, vol. 20 (1), 2005, pp. 24-36.

Young, et al., "Chapter 14: Bodies in Contact Undergoing Direct Bearing and Shear Stress", Roark's Formulas for Stress and Strain, McGraw-Hill, 7th Edition, New York, 2002, p. 703.

Newman et al., "Modeling the Affect of a Downhole Vibrator", SPE 121752, 2009 SPE/ICoTA Coiled Tubing and Well Intervention Conference and Exhibition, The Woodlands, TX, Mar. 31-Apr. 1, 2009, 10 pages.

Sola et al., "New Downhole Tool for Coiled Tubing Extended Reach", SPE 60701, 2000 SPE/ICoTA Coiled Rubing Roundtable, Houston, TX, Apr. 5-6, 2000, 8 pages.

Castaneda et al., "Coiled Tubing Milling Operations: Successful Application of an Innovative Variable-Water Hammer Extended-Reach BHA to Improve End Load Efficiencies of a PDM in Horizontal Wells", SPE 143346, SPE/ ICoTA Coiled Tubing and Well Intervention Conference and Exhibition, The Woodlands, TX, Apr. 5-6, 2011, 19 pages.

Robertson et al., "Dynamic Excitation Tool: Developmental Testing and CTD Field Case Histories", SPE 89519, SPE/ICoTA Coiled Tubing Conference and Exhibition, Houston, TX, Mar. 23-24, 2004, 16 pages.

Newman et al., "Friction Reduction for Microhole CT Drilling: Final Technical Report", www.ctes.com, CTES, L.P., Jun. 1, 2007; 35 pages.

Wicks et al., Modeling of Axial Vibrations to Allow Intervention in Extended Reach Wells, SPE 156017, SPE Deepwater drilling and Completions Conference, Galveston, TX, Jun. 20-21, 2012, 15 pages.

* cited by examiner

TECHNIQUE FOR ESTABLISHING PREDICTIVE REACH THROUGH A DEVIATED WELL

PRIORITY CLAIM/CROSS REFERENCE TO RELATED APPLICATION(S)

This Patent Document claims priority under 35 U.S.C. §119 to U.S. Provisional App. Ser. No. 61/611,491, entitled "Method for Predicting Reach Extension" filed on Mar. 15, 2012, and incorporated herein by reference in its entirety.

BACKGROUND

Exploring, drilling and completing hydrocarbon and other wells are generally complicated, time consuming and ultimately very expensive endeavors. In recognition of these expenses added emphasis has been placed on maximizing each given well's life and productivity over the course of the well's life. Thus, well logging, profiling and monitoring of well conditions are playing an ever increasing role in oilfield operations. Similarly, more actively interventional applications are regularly called for such as clean-out applications, opening or closing valves and sliding sleeves or any number of other maneuvers targeting maximized recovery and well life.

In addition to regular intervention for sake of monitoring and/or managing well operations, the well itself may also be of fairly sophisticated architecture. For example, in an attempt to maximize recovery from the reservoir and extend the useful life of the well, it may be of a fairly extensive depth and tortuous configuration. This may include overall depths in the tens of thousands of feet range. Once more, such wells may include extended horizontal or deviated sections of several thousand feet. As a result, interventions through such wells are becoming of ever increasing difficulty as noted below.

The above described interventions through deviated wells are generally achieved by way of coiled tubing, pipe or other suitable form of rigid or semi-rigid well access line. Thus, a logging, clean-out, shifting or other application tool may be driven through deviated well sections. Unfortunately, after a few thousand feet of conveyance through such a section, the tubing will generally begin to undergo sinusoidal buckling. This is followed by helical buckling, and soon thereafter, helical lock of the line within the deviated section such that further advancement is impossible. Of course, this is problematic where the target location for the application at hand is at a location beyond the location of the locked up, now immobile end of the coiled tubing. Further, this problem has become increasingly common given the ever increasing depths of wells and deviated well sections.

Various techniques or conveyance aids have been developed to help extend the reach of coiled tubing through such deviated sections such that the appropriate application tool may arrive at the desired target location. For example, a friction reducer may be introduced through the coiled tubing during conveyance, particularly through a deviated section. As a result, an added 10-15% or so of coiled tubing reach may be realized. In circumstances where the deviated well section is under about 3,000 feet, this may make all the difference in allowing the coiled tubing to fully traverse the section. However, as deviated well sections become longer and longer, use of a friction reducer in this manner may not be effective.

Alternatively, downhole tractoring may be used to pull the coiled tubing through the deviated well section. That is, well tractors may be attached to the coiled tubing, positioned in the well, and employed to advance downhole, pulling the coiled tubing through the well including such problematic deviated sections. Such tractoring may be fairly effective. For example, it might not be unreasonable to expect to be able to traverse as much as a 6,000 foot deviated section in this manner.

Unfortunately, while effective, the cost of tractoring is often exorbitant. In today's dollars hundreds of thousands of dollars may be spent on a dedicated tractoring conveyance application. Further, a couple of days worth of time may be lost to rig up time, not to mention the potentially added footspace requirements that may be needed at the oilfield for associated tractoring equipment. Once more, this lost time and expense assumes a successful tractoring operation. However, should a tractor fail or become stuck downhole, the added time and expense necessary to redress the issue may translate into lost hundreds of thousands if not upwards of a million dollars for the operator.

Understandably, alternatives to either tractoring or friction reducers are desirable. Accordingly, more recent attempts to help extend coiled tubing reach through deviated sections include use of vibration tools integrated with the coiled tubing. These tools may be operated at a pre-determined amplitude and frequency as an aid to extending the reach of the coiled tubing. These vibration techniques are generally considered more effective than mere introduction of a friction reducer. Once more, the cost of utilizing a vibration tool is unlikely to approach that of tractor usage.

Unfortunately, ascertaining the degree of extended reach aid afforded by a given vibration tool and technique remains a challenge. Thus, as a practical matter, the operator may be left largely blind guessing to use vibration assistance only to become stuck before reaching the target depth and thus have to retry with a different set of vibration parameters or even worse to completely retry with a new tractoring application. Where the latter is the case, the exorbitant cost of extending reach via tractor has now only been further increased.

SUMMARY

Techniques for establishing predictive reach by a line such as coiled tubing through deviated well sections are disclosed herein. These may include providing well and line architecture data and accounting for the axial-exclusive estimated friction between the line and a wall of the well. This may be thought of as the contact force that results due to contact of the line with the wall during a conveyance application through the deviated section. Regardless, a practical prediction of load-based dynamic behavior of the line over the deviated section during the conveyance application may be established.

DETAILED DESCRIPTION

Embodiments are described with reference to certain downhole applications through deviated well sections that may benefit from vibration assistance for sake of extended line reach. In particular, coiled tubing line is utilized to deliver a cleanout tool to a target location in a deviated or horizontal well section. Thus, debris may be cleaned out for sake of enhancing production from the area of the target location. However, a variety of other applications may benefit from predictive reach techniques as detailed herein. For example, the well access line may be coiled tubing, drill pipe, casing or any other forcible tubular conveyance line may benefit from such predictive reach techniques. Further, the applications may be directly interventional such as the noted cleanout or of a passive nature such as a logging application. So long as a predictive reach technique is employed that makes use of a vibration tool to aid in line conveyance through the well, predictive reach may be estimated in an enhanced and practical manner.

Figure 1:
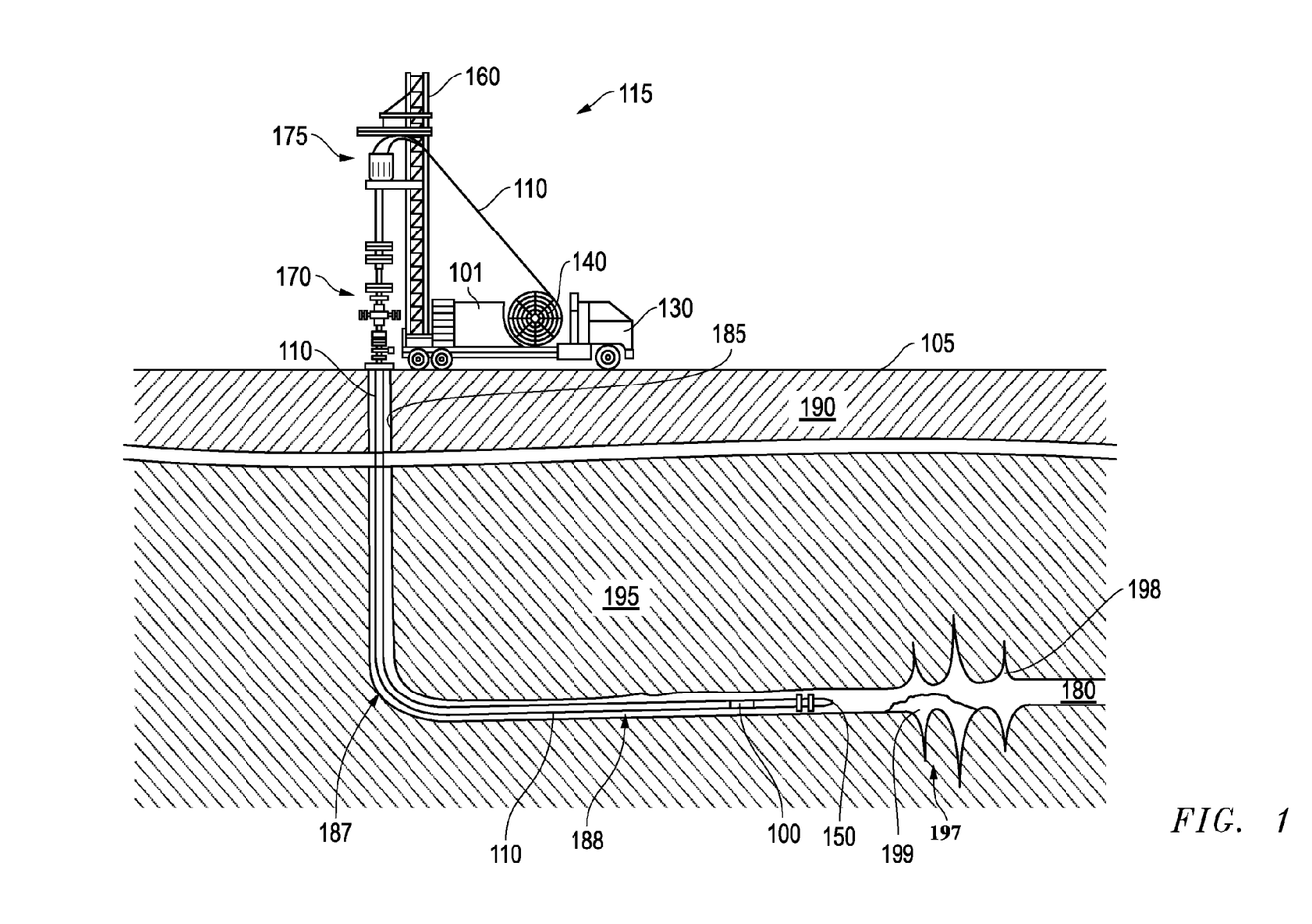
FIG. 1 is an overview of an oilfield accommodating a deviated well with a line run therein for taking advantage of an embodiment of a predictive reach technique.

Referring now to FIG. 1, an overview of an oilfield 105 is shown which accommodates a deviated well 180 with a coiled tubing 110 line run therein. The tubing 110 is run through the well 180 in the manner depicted while taking advantage of an embodiment of a predictive reach technique as detailed further below. More specifically, the coiled tubing 110 is advanced and directed through a host of surface equipment 115 that may include a control unit 101 for directing a coiled tubing application. In the embodiment shown, a cleanout application may be directed by the unit 101 and carried out through a cleanout tool 150 at the end of the coiled tubing 110. Of course, a host of other downhole tool types and applications may be the focus of such a coiled tubing conveyance. Additionally, the unit 101 depicted, or another computing device, may be employed to not only direct the conveyance of the coiled tubing 110 but also to establish predictive reach of the coiled tubing 110, for example through a deviated well section 188.

Continuing with reference to FIG. 1, the predictive reach of the coiled tubing 110, or how far the tubing 110 is able to reach through the deviated section 188, is a result of many factors. These factors may include the architecture of the well 180, dimensions of the coiled tubing 110, speed of the conveyance, any potential conveyance aids, etc. For example, in the embodiment shown, a vibration tool 100 is incorporated into the tubing 110 and operated at preset parameters or intervals of frequency and amplitude as detailed further below (see FIG. 3A). Once more, based on such assumed parameters and the other noted factors, embodiments of predictive reach techniques may be carried out by the control unit 101 or other computing device as detailed further below. Thus, an operator at the oilfield surface 105 may be afforded near term useful information about the application being run. More specifically, embodiments of predictive reach techniques detailed hereinbelow may be carried out in less than about five minutes on a conventional computing device such as the unit 101 or other computing device as detailed further below. In the example embodiment of FIG. 1 this may translate to providing an operator with a near-immediate and reliable estimate of the likelihood of the cleanout tool 150 reaching debris 199 for cleanout (or another tool reaching a desired location in the well) under a given set of assumed conditions. The predictive reach techniques may be carried out on a computing device away from the control unit 101, for example, far in advance of operations.

The cleanout application depicted in FIG. 1 is directed at debris 199 at a production region 197. Thus, perforations 198 at the production region 197 may be rendered more effective for sake of production fluid uptake from the adjacent formation 195. However, reaching such a target location for an application may be a significant undertaking. Indeed the surface equipment 115 involved may include a mobile coiled tubing truck 130 or other delivery mode for a reel 140 of tubing 110. Thus, the tubing 110 may be drawn up and controllably injected via a rig 160 and goose-neck injector 175. In this manner, the tubing 110 may be forced through pressure control equipment 170, often referred to as a blowout preventer arrangement. However, the well 180 is deviated. Therefore, the task of getting the coiled tubing 110 further downhole and through the deviated section 188 remains.

By way of example, the well 180 may be 10,000 feet in total depth. After vertically traversing multiple formation layers 190, 195, for say, 4,000 feet, an elbow 187 or transition may take place for several hundred feet. Thus, the remaining several thousand feet of the well 180 may constitute the deviated section 188 described above. With perhaps over 5,000 feet of deviated section 188 to traverse, depending on the exact location of the target location of debris 199, the question for the operator is whether the coiled tubing 110 will reach the location, for example, without use of a tractor.

More specifically, while not itself a tractor, a certain degree of "effective" or "equivalent" tractoring force may be expected from the vibration tool 100 so as to extend the reach of the coiled tubing 110. That is, a comparative example type of conventional downhole tractor may afford up to about 4,000 lbs. of pull force. Similarly, while not technically a pulling device, the tool 100 of FIG. 1, may nevertheless effectively aid or extend the reach of the tubing 110 in a manner that may be compared with such tractoring or pulling. In this manner, an example embodiment of a vibration tool 100 and application may provide an effective tractoring force approaching tractor-type pull forces. It is the techniques as detailed hereinbelow which may be used by the operator so as to determine the degree of this effective tractoring or extended reach that may be afforded by any given set of vibration tool 100 and other conveyance parameters and factors, even before the coiled tubing 110 is deployed into the well 180.

Figure 2A:
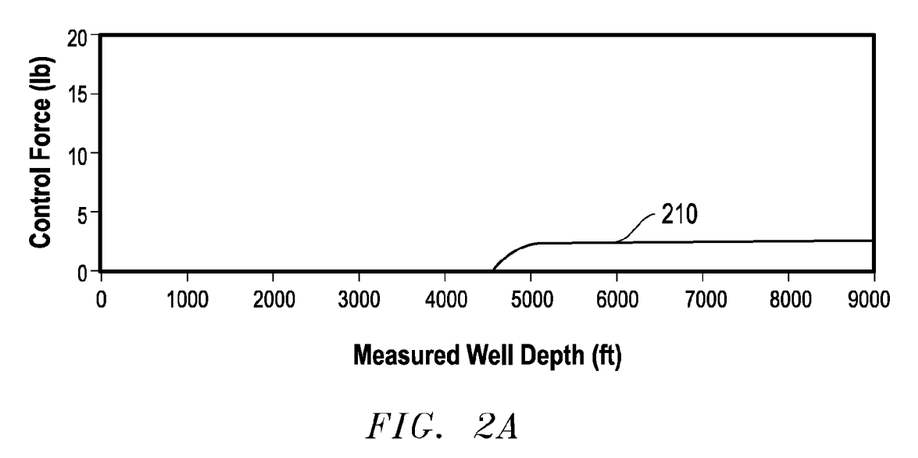
FIG. 2A is a chart relative the technique which depicts theoretical lateral static contact forces of the coiled tubing line of FIG. 1 within the well.

Referring now to FIG. 2A, with added reference to FIG. 1, a chart relative a technique of establishing predictive reach is shown. Specifically, the chart depicts theoretical lateral static contact forces of the coiled tubing 110 within the well 180. That is, with data relative the coiled tubing 110 stored at the control unit 101 and factors such as the weight and stiffness of the coiled tubing 110, a survey of the well 180, known contact forces between the tubing and the wall 185 of the well 180 may be calculated. With the tubing 110 assumed to be in a static state, the relatively level plot 210 is shown indicative of tubing 110 at rest along the deviated well section 188 beginning after about 4,000 feet of well depth (according to the above example). It is of note that spikes in force of about 15 lbs. or more may also present as the tubing 110 enters the deviated section 188. However, as a matter of clarity in presentation, such spikes in force are not depicted in FIG. 2A.

Figure 2B:
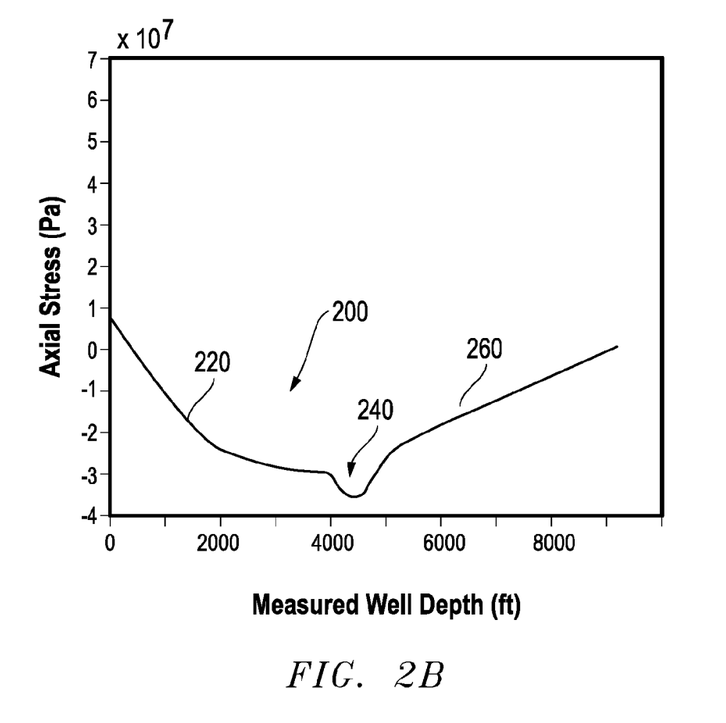
FIG. 2B is a chart relative the technique which depicts theoretical axial stress on the coiled tubing line as it is forcibly conveyed through the well of FIG. 1.

While the chart of FIG. 2A, reflects a theoretical static condition, the same data stored at the control unit 101 may be used to predict and plot the dynamic circumstance of actually forcing the coiled tubing 110 through the well 180 of FIG. 1. More specifically, FIG. 2B is a chart relative a predictive technique which depicts theoretical axial stress on the coiled tubing line as it is controllably conveyed through the well 180, and more specifically, its deviated section 188. The plot line 200 of FIG. 2B reflects axial stress in Pascals (Pa) depending on the depth achieved by the dynamically moved coiled tubing 110 through the deviated section. For example, over the course of the initial 4,000 feet or so through the well 180, axial stress on the coiled tubing 110 is notably smooth (220). However, at some point, a location of helical buckling 240 emerges as the tubing 110 transitions into the deviated section 188.

Continuing with reference to FIG. 2B, the axial load or stress at the downhole end of the tubing is inherently zero (at the far right of the plot (260)). Nevertheless, due to the intervening transition into the deviated section 188 and depending on a host of factors including the total depth into this section, the tubing 110 eventually becomes locked in position. In this case, the chart reveals that lock-up results with the coiled tubing 110 falling short of reaching 10,000 feet through the well 180. This translates into a reach of well under 5,000 feet through the deviated section 188.

The chart of FIG. 2B reflects conventional coiled tubing advancement, particularly through a deviated section 188. Similarly, the chart of FIG. 2A also depicts known characteristics regarding conventional coiled tubing 110. However, these charts may be employed to provide more than just likely scenarios regarding conventional coiled tubing injection applications. Specifically, with added reference to FIGS. 3A and 3B, techniques may also be employed for establishing how much further the coiled tubing 110 might extend beyond the lock-up depicted in FIG. 2B. For example, assumed parameters of vibration assistance (FIG. 3A) may be entered into the predictive software application at the control unit 101, or similar computing device, as noted above, to test the amount of extended reach that might be expected (FIG. 3B).

It may be of significant advantage to the operator to tailor the particular parameters that are employed by the noted software application. For example, as indicate above, techniques detailed herein may be performed in a matter of minutes. Specifically, an operator may enter a few variable test parameters for a particular vibration application and obtain a predictive reach plot in a matter of minutes. That is, while a full three dimensional modeling, processed over the course of several hours or even days may be of some value, a more efficient and nearer-term modeling based on select parameters may be of more practical value to the operator.

In order to achieve more efficient practical modeling on an as needed basis, techniques herein may focus on variables associated with well geometry, coiled tubing dimensions and properties, proposed vibrator amplitude and frequency parameters and friction. More specifically, the friction variable may be limited to axial-exclusive estimated friction between the coiled tubing and well wall for the extent of a proposed conveyance. That is, a static, three-dimensional analysis may be used to predict reach. Thus, a reliable plot as depicted in FIG. 3B (below) may be generated in a matter of minutes.

Continuing with reference to FIGS. 2A and 2B, with added reference to FIG. 1, modeling techniques that do not yet account for reach extension through vibration assistance may nevertheless remain of value and be employed with the static, three-dimensional analysis as indicated above. For example, a one-dimensional dynamic simulation model may be generated that assumes a finite elastic body of coiled tubing along the axis of the deviated section 188 of the well 180.

The charts of FIGS. 2A and 2B may assume a 2 inch outer diameter tubing 110 of 0.156 inch wall thickness by way of example. Regardless, the software may be configured to split up the coiled tubing representation into rigid segments connected by intervening springs so as to represent the axial elasticity thereof. Alternatively, the tubing 110 may be assumed to be constructed of beam elements of elastic material with predictive known behavior. In either case, as opposed to a three dimensional model, a predetermined number of segments may be considered in making such calculations for sake of computational efficiency.

With the above values established, a dry friction mode may be employed by the software with static and dynamic coefficients of friction so as to define the frictional behavior for stationary and moving segments of the tubing 110. Of course, this concept may also be utilized with other models such as a Stribeck friction model or other axial mud drag models to account for non-dry environments. Whatever the case, such computations along with theoretical position and advancement of the tubing 110 may be used to generate the values as depicted in FIG. 2B.

Figure 3A:
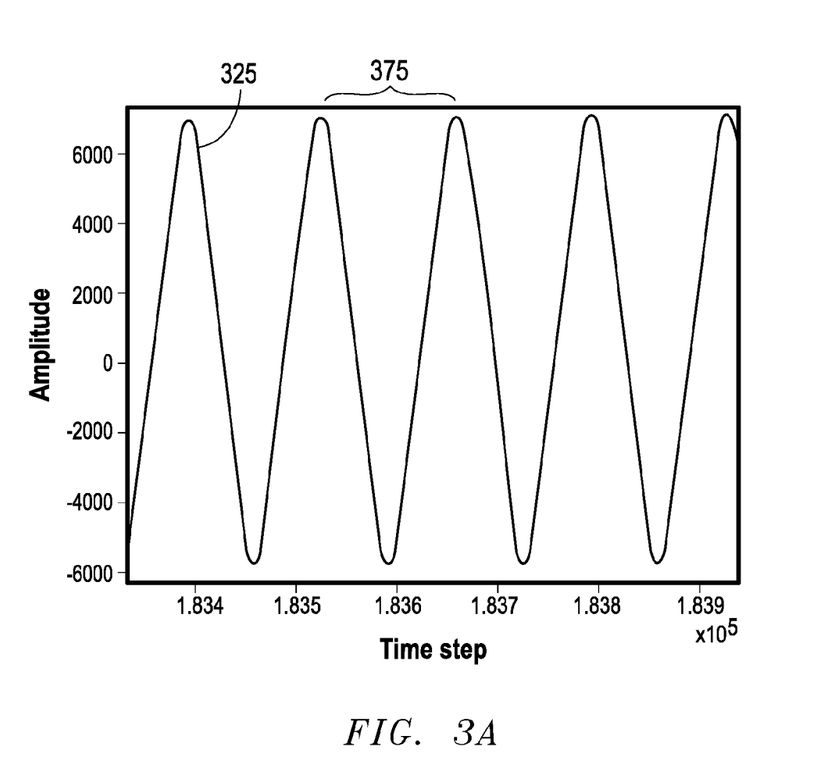
FIG. 3A is a chart relative the technique which depicts theoretical vibration parameters relative the technique that may be applied to the line of FIG. 1.
Figure 3B:
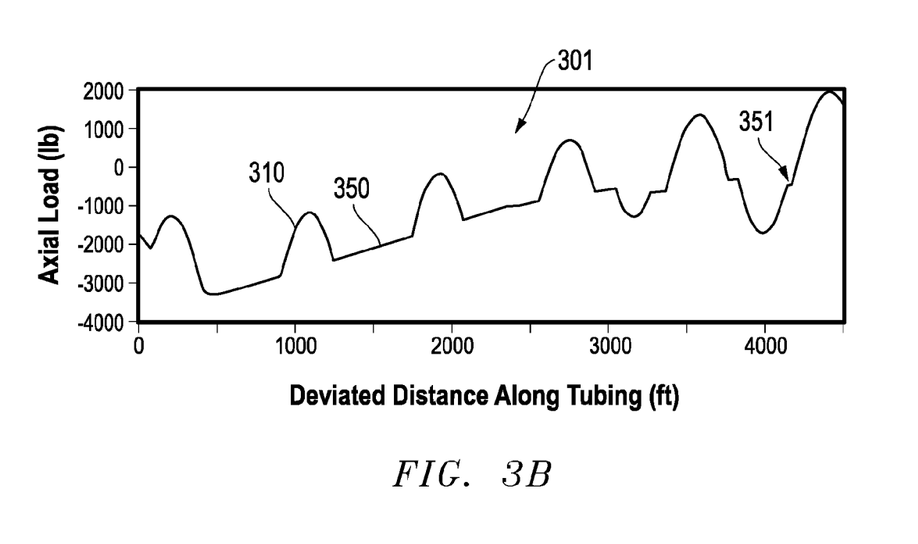
FIG. 3B is a chart which depicts stress generally on a line in the well of FIG. 1 based on the estimates afforded by employment of the technique.

Referring now to FIG. 3A a chart relative the technique is shown which theoretical vibration parameters that may be applied to the coiled tubing of FIG. 1. That is, the non-vibration simulation of FIG. 2B may employ vibration assistance as represented in FIG. 3A. Thus, a variety of different injection speeds may be used to model a host of different extended reach results via vibration assistance as shown in FIG. 3B and detailed further below. Maintaining focus on FIG. 3A for the moment though, example parameters for vibration assistance through the vibration tool 100 of FIG. 1 may include a sinusoidal axial excitation of about 1,000-8,000 lbs. at up to 200 Hz or higher. This may be seen with reference to amplitude peaks 325 at the chart of FIG. 3A. Similarly, an example frequency 375 may be seen at the chart of FIG. 3A, peak to peak, with reference to time.

Referring now to FIG. 3B, with added reference to FIG. 1, the chart is shown which depicts a plot 301 of predictive reach based on the estimates afforded by employment of techniques described hereinabove. Notably, moving left to right, axial load increases along the entirety of the coiled tubing 110 through the deviated section 188 of the well 180. However, with reference to distance at the x-axis, it is also apparent that the tubing 110 is nevertheless afforded extended reach across the entirety of the deviated section 188. Once more, axial load on the natural progression of the coiled tubing is apparent with reference to the smooth increase 350 that moves from a minimal load at the left to an end point 351 at the right (at least in terms of what is depicted on the chart). Furthermore, intermittent spikes in load 310 are also apparent moving from left to right. Thus, the effect of the vibrator tool 100 may be seen, greater and greater as the tubing 110 moves further downhole (i.e. to its vibrator location).

All in all, the operator is able to test and determine the effectiveness of a proposed conveyance application as depicted in FIG. 3B in a matter of minutes or less as opposed to a day of lost time that would be required for full three dimensional modeling. This nearly real-time modeling is due to the focused type of inputs relative software at the control unit 101, or in another suitable computing device, which employs a static one dimensional dynamic analysis as described hereinabove and further below.

Figure 4:
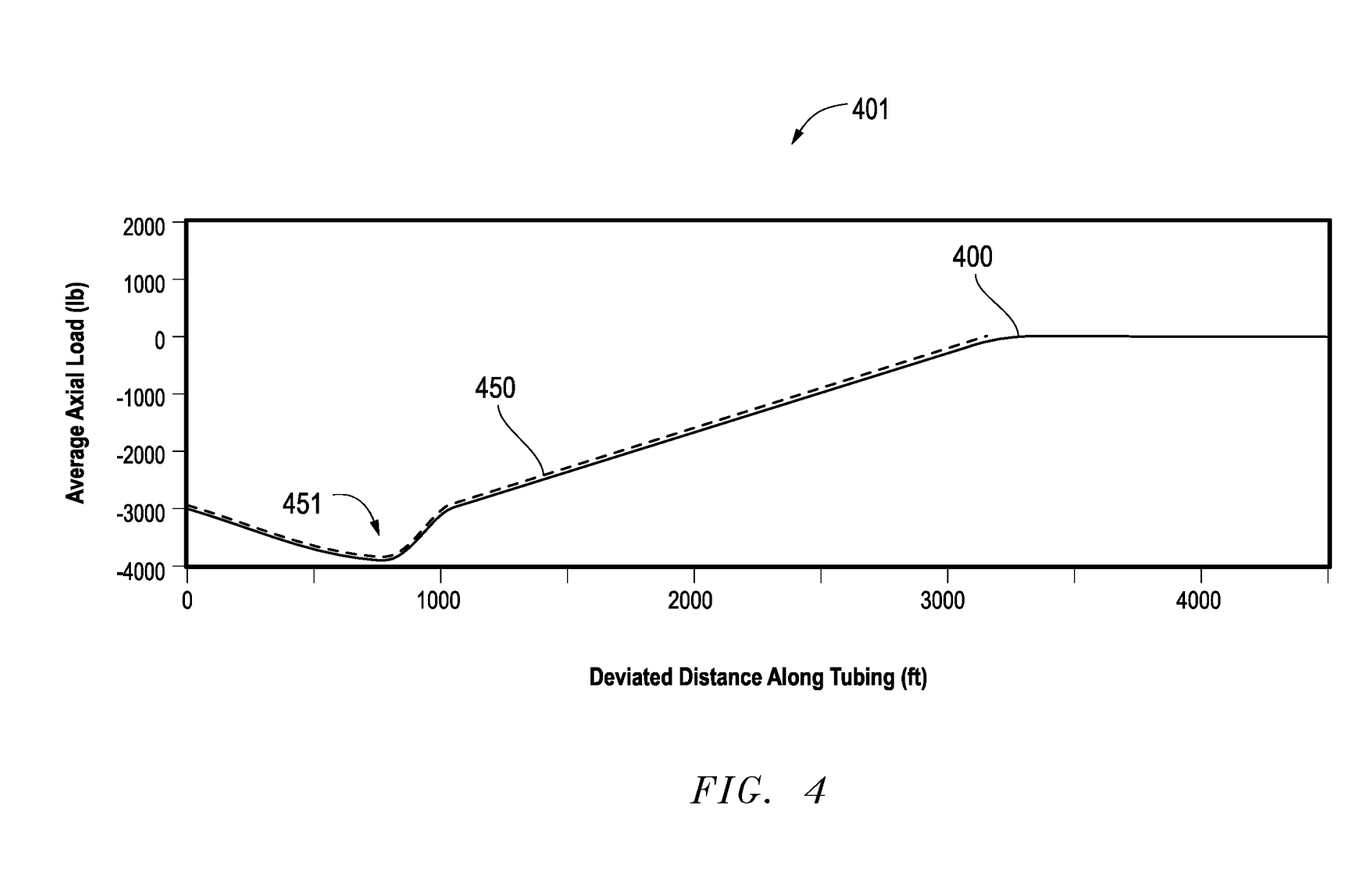
FIG. 4 is a chart comparison of the predictive reach of the line of FIG. 3B in contrast to predictive reach in absence of vibration parameters.

With added reference to FIG. 1 and for sake of comparison, FIG. 4 is a chart comparison 401 of the predictive reach of the tubing 110 of FIG. 3B in contrast to predictive reach in absence of vibration parameters (e.g. as shown in FIG. 2B). FIG. 4 again reveals the extended reach 400 in terms of load versus distance, but with the intermittent vibrator induced spikes 310 of FIG. 3B removed for sake of clarity. Thus, a less obstructed comparison of the extended reach 400 of the tubing 110 is provided when represented adjacent a non-extended reach plot 450. Namely, both vibration assisted 400 and non-assisted 450 plot lines are presented with the challenge of buckling 451 as the tubing 110 enters the deviated section 188 of the well 180. However, while the non-assisted plot line 450 reveals lock up at about 3,000 feet through the deviated section 188, the vibration assisted, extended reach plot line 400 reveals a comparatively extended reach of at least about 1,500 feet further through the deviated section 188.

As noted above, the technique of predicting reach extension may also be considered a manner of quantifying an effective tractoring force based on the tested parameters. In one embodiment, a quantified effective tractoring force may itself be used to generate subsequent simulations. For example, the computed effective tractoring force from the one dimensional dynamic simulation may be used for subsequent one dimensional static calculations for sake of establishing reach extension. That is, in this technique, only the initial calculations for establishing effective tractoring force need be dynamic. Subsequent calculations may be static with reliance on the now-established effective tractoring force. Thus, from an efficiency standpoint, so long as speed, vibration parameters and line architecture (and material properties) remain constant, new dynamic calculations of effective tractoring force need not be re-established for every simulation. As a practical matter, this also means that this type of technique may be readily implemented consistent with more traditional practice of running static calculations.

Figure 5:
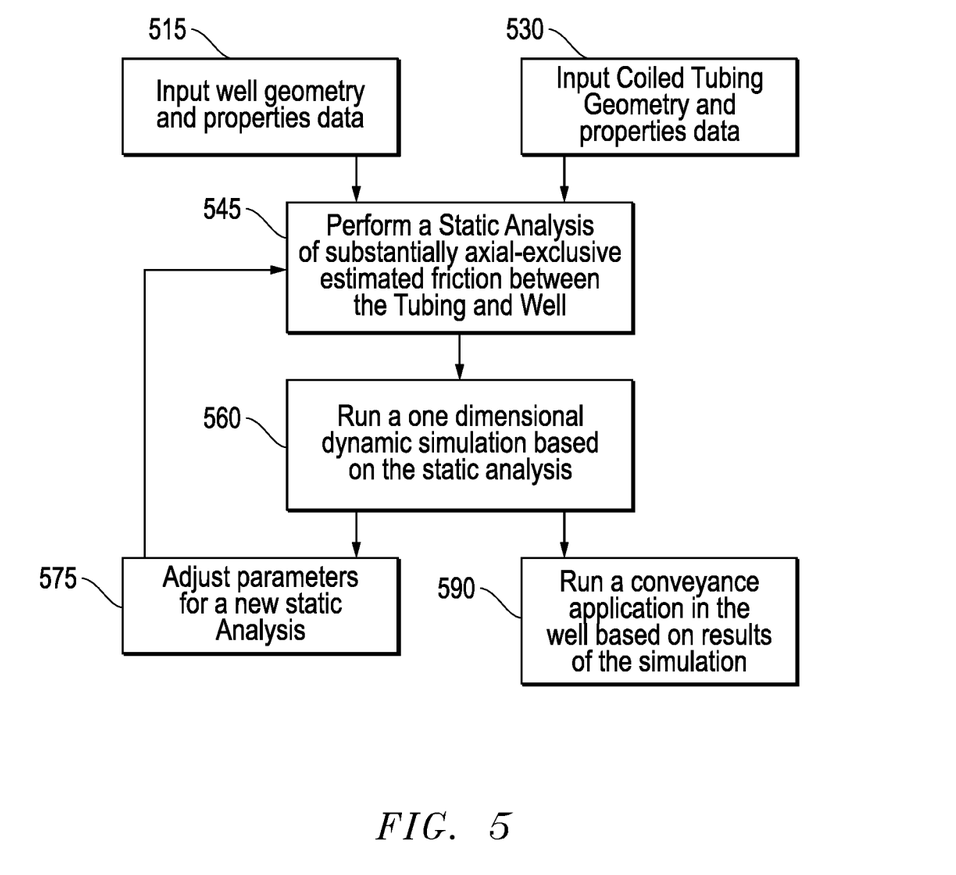
FIG. 5 is a flow-chart summarizing an embodiment of employing axial load-based techniques to predict reach of a vibration assisted line through a deviated well.

Referring now to FIG. 5, a flow-chart is shown that summarizes an embodiment of employing axial load-based techniques to establish predictive reach for a line conveyance through a deviated well. The techniques are particularly useful for estimating reach extension or equivalent tractoring force where the reach is vibration assisted and the predictive modeling involved is sought in a time efficient manner.

In order to achieve such short term modeling, data regarding well properties and geometry may be stored at a computing device as indicated at 515. The data may relate to well diameter, depth, overall architecture and wall characteristics such mud, casing surface, etc. Similarly, as indicated at 530, geometry and properties data regarding the coiled tubing or other line conveyance may be stored at the computing device (e.g. the control unit 101 of FIG. 1). This data may relate to tubing diameter, materials, prior wear, historical usage, etc. With this data loaded at the computing device, a static analysis may be performed via software that accounts for the interference, referred to herein as "substantially axial-exclusive estimated friction", between the tubing and the well as indicated at 545.

With such a static analysis available, a one dimensional simulation or dynamic analysis may now be generated as indicated at 560 in a matter of minutes. That is, a one dimensional dynamic model of reach extension is attained from a three dimensional static model. This is done with a conveyance speed selected for testing and the contact force from the static analysis being used in the axial friction calculation of the one dimensional dynamic analysis. Ultimately, depending on the results of the modeling, the vibration assisted conveyance may be run as tested (see 590) or, where modeling advises against the run due to reach limitations, parameters may be adjusted an another proposed scenario tested according to the technique (see 575).

Embodiments described hereinabove include techniques that allow for enhancing practical alternatives to conventional tractoring, where vibration assistance is used with improved efficacy and reliability as a result of techniques detailed herein. Thus, an operator is provided with an economically competitive alternative to other extended reach techniques. Further, the degree of greater reach may be substantially accurate and ascertained in a short-term fashion without necessarily requiring full three dimensional modeling or an impractical amount of operator dedicated time and resources therefor. More specifically, one dimensional, axial based inputs may be used to efficiently capture three dimensional behavior of coiled tubing through deviated well sections in a substantially accurate manner.

The preceding description has been presented with reference to presently preferred embodiments. Persons skilled in the art and technology to which these embodiments pertain will appreciate that alterations and changes in the described structures and methods of operation may be practiced without meaningfully departing from the principle, and scope of these embodiments. For example, embodiments herein are described with reference to purely predictive techniques. However, in other embodiments, the tubular may be equipped with a sensor, fiber optics or other means for attaining real-time data regarding reach extension of a given conveyance.

Additionally, broader insights into vibration assisted conveyance generally may also be gleaned, such as whether higher excitation rates at lower injections speeds would tend to minimize a required pushing load at a given depth, or any other number of proposed conveyance operation hypotheses. Regardless, the foregoing description should not be read as pertaining only to the precise structures described and shown in the accompanying drawings, but rather should be read as consistent with and as support for the following claims, which are to have their fullest and fairest scope.

We claim:

1. A method of establishing a predictive reach of a well access line in a deviated section of a well during a conveyance application, the method comprising:
   providing data indicative of well geometry and well access line architecture;
   performing a three dimensional static analysis of an estimated friction between the well access line and a wall of the well during the conveyance application;
   predicting the reach of the well access line over the deviated section during the conveyance application by inputting proposed vibration parameters for a vibration tool of the well access line in the deviated section of the well;
   obtaining an effective tractoring force of the vibration tool as an equivalent of pulling force on the well access line during the conveyance application; and
   employing the effective tractoring force in a static analysis to establish the predictive reach; and running the conveyance application in the well with the well access line based on the predicted reach of the well access line.

2. The method of claim 1 wherein predicting the reach of the well access line comprises a one dimensional dynamic simulation based on the three dimensional static analysis.

3. The method of claim 1 wherein predicting the reach of the well access line further comprises determining a contact force for the well access line at different well depths.

4. The method of claim 1 wherein the estimated friction comprises axial-exclusive estimated friction.

5. The method of claim 1 wherein predicting the reach of the well access line comprises an initial predicting of the well access line behavior, the method further comprising adjusting the proposed vibration parameters and performing a subsequent predicting the reach of the well access line in light of results of the initial predicting.

6. The method of claim 1 wherein predicting the reach of the well access line comprises:
    obtaining an effective tractoring force as an equivalent of pulling force on the well access line during the conveyance application; and
    employing the effective tractoring force in a static analysis to establish the predictive reach.

7. A method of predicting an effective tractoring force for a vibration assisted downhole conveyance of coiled tubing in a well at an oilfield, the method comprising:
    storing geometric and physical data of the well at a computing device;
    inputting geometric and physical data of the coiled tubing at the computing device;
    performing a three dimensional static analysis of an estimated axial friction between the coiled tubing and the well for a proposed downhole conveyance;
    running a one dimensional dynamic simulation based on the three dimensional static analysis to determine the effective tractoring force of the coiled tubing based on an injection speed of the coiled tubing and a vibration tool attached to the coiled tubing;
    establishing a reach extension based on the one dimensional dynamic simulation based on the determined effective tractoring force; and
    running an application in the well with the coiled tubing and the vibration tool if the reach extension reaches a desired location.

8. The method of claim 7 wherein performing a three dimensional static analysis further comprises employing software of the computing device to establish a coiled tubing representation split into rigid segments connected by intervening springs to represent the axial elasticity of the coiled tubing.

9. The method of claim 7 wherein performing a three dimensional static analysis further comprises employing software of the computing device to establish a coiled tubing representation constructed of beam elements of elastic material with predictive known behavior.

10. The method of claim 7 wherein the physical data of the well comprises well wall and surface properties and the physical data of the coiled tubing comprises weight and surface properties thereof.

11. The method of claim 10 further comprising:
    employing software of the computing device to establish a representation of an axially disposed finite body of the coiled tubing along a deviated section of the well; and
    utilizing the physical data of the well and the coiled tubing to establish contact forces between the coiled tubing and the wall in the deviated section of the well from the three dimensional static analysis.

12. The method of claim 7 wherein the estimated axial friction comprises an analysis with predetermined coefficients defining frictional behavior and stored at the computing device.

13. The method of claim 7 wherein the estimated axial friction comprises axial-exclusive estimated friction and further comprises one of a Stribeck friction analysis and a mud drag analysis to account for a non-dry well environment.

14. A system for conveyance of a well access line through a well at an oilfield, the system comprising:
    a well access line having a tool on an end thereof for performing a wellbore application and a vibration tool for assisted conveyance of the well access line through a deviated section of the well;
    surface equipment configured to controllably inject the well access line into the well;
    a computing device for storing data indicative of well and well access line geometric and physical data; and
    software of the computing device for performing a static analysis of estimated friction between the well access line and a wall of the well during conveyance of the well access line through the deviated section of the well and for predicting an effective tractoring force of the surface equipment and the vibration tool during conveyance of the well access line.

15. The system of claim 14 wherein the well access line is selected from a group consisting of coiled tubing and drill pipe.

16. The system of claim 14 wherein the estimated friction comprises axial exclusive estimated friction.

17. The system of claim 14 wherein well geometric and physical data comprises at least one of well diameter, depth, overall architecture, wall characteristics, and casing surface and wherein well access line geometric and physical data comprises at least one of tubing diameter, materials, prior wear, and historical usage.

18. The system of claim 17 wherein the computing device is a control unit for directing the conveyance of the well access line and the wellbore application from the oilfield.

* * * * *